(12) United States Patent
Prajuckamol et al.

(10) Patent No.: US 10,966,335 B2
(45) Date of Patent: Mar. 30, 2021

(54) FIN FRAME ASSEMBLIES

(71) Applicant: SEMICONDUCTOR COMPONENTS INDUSTRIES, LLC, Phoenix, AZ (US)

(72) Inventors: Atapol Prajuckamol, Thanyaburi (TH); Chee Hiong Chew, Seremban (MY); Yushuang Yao, Shenzhen (CN)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/587,549

(22) Filed: Sep. 30, 2019

(65) Prior Publication Data
US 2020/0344905 A1  Oct. 29, 2020

Related U.S. Application Data

(60) Provisional application No. 62/840,104, filed on Apr. 29, 2019.

(51) Int. Cl.
*H05K 7/20* (2006.01)
*H05K 5/06* (2006.01)

(52) U.S. Cl.
CPC ......... *H05K 5/066* (2013.01); *H05K 7/20272* (2013.01)

(58) Field of Classification Search
CPC . H01L 23/3672; H01L 23/467; H01L 23/367; H01L 23/3677; H01L 21/4882; G06F 1/20; G06F 2200/201; H05K 2201/066; H05K 7/20418; H05K 1/0203; H05K 7/209
USPC ....... 361/700, 709, 690, 702, 697; 165/80.3; 257/E23.099, E23.103
See application file for complete search history.

(56) References Cited

U.S. PATENT DOCUMENTS

| 5,749,647 | A | * | 5/1998 | Migny | ...... G09F 9/30 362/236 |
| 5,964,285 | A | * | 10/1999 | Huang | ...... H01L 23/3672 165/185 |
| 6,199,624 | B1 | * | 3/2001 | Wotring | ...... H01L 23/3672 165/121 |
| 7,492,599 | B1 | * | 2/2009 | Yu | ...... F21K 9/00 165/185 |
| 7,817,425 | B2 | * | 10/2010 | Jeong | ...... H05K 7/20963 361/704 |
| 2012/0113597 | A1 | * | 5/2012 | Verplaetse | ...... F21V 29/89 361/709 |
| 2014/0043765 | A1 | * | 2/2014 | Gohara | ...... H05K 7/20927 361/699 |

* cited by examiner

*Primary Examiner* — Mandeep S Buttar
(74) *Attorney, Agent, or Firm* — Adam R. Stephenson, Ltd.

(57) ABSTRACT

A fin frame baseplate is disclosed. Specific implementations include a baseplate configured to be coupled to a substrate, a fin frame including a base portion coupled to the baseplate, and a plurality of fins extending from the base portion, the plurality of fins protruding from the base portion. The fin frame may include a plurality of openings therethrough.

16 Claims, 8 Drawing Sheets

FIN FRAME ASSEMBLIES

CROSS REFERENCE TO RELATED APPLICATIONS

This document claims the benefit of the filing date of U.S. Provisional Patent Application 62/840,104, entitled "Fin Frame Baseplate" to Prajuckamol et al., which was filed on Apr. 29, 2019, the disclosure of which is hereby incorporated entirely herein by reference.

BACKGROUND

1. Technical Field

Aspects of this document relate generally to semiconductor components. More specific implementations involve semiconductor baseplates used in semiconductor package assemblies.

2. Background

Semiconductor packages contain components that produce heat that must be dissipated to ensure continued proper operation of the components. Semiconductor baseplates may aid in the dissipation of heat from the semiconductor components.

SUMMARY

Implementations of a fin frame assembly may include: a baseplate configured to be coupled to a substrate, a fin frame including a base portion coupled to the baseplate, and a plurality of fins extending from the base portion, the plurality of fins protruding from the base portion. The fin frame may include a plurality of openings therethrough.

Implementations of the fin frame assembly may include one, all, or any of the following:

A shape of each opening of the plurality of openings may correspond with a shape of each fin of the plurality of fins.

A shape of each opening of the plurality of openings may correspond with a shape of two or more fins of the plurality of fins.

A shape of each fin of the plurality of fins may be substantially rectangular.

The plurality of fins may include pairs of fins, and each of the pairs of fins may include complementarily angled portions defined by a diagonal line between each fin in each pair of fins.

A cooling jacket may be coupled to the baseplate over the fin frame.

The cooling jacket may be configured to direct a cooling fluid to pass over the plurality of fins.

The fin frame may be made of a single piece of material.

The fin frame may be coupled to the baseplate by at least one of welding, soldering, or bonding.

Implementations of a conductive plate may include: a baseplate configured to be coupled to a substrate and a plurality of folded projections coupled at a plurality of openings. A shape of each folded projection of the plurality of folded projections may correspond with a shape of each opening of the plurality of openings.

Implementations of a conductive plate may include one, all, or any of the following:

The shape of each opening of the plurality of openings may correspond with a shape of two or more folded projections of the plurality of folded projections.

The shape of each folded projection of the plurality of folded projections may be substantially rectangular.

The plurality of folded projections may include pairs of folded projections, and each of the pairs of folded projections may include complementarily angled portions defined by a diagonal line between each folded projection in each pair of folded projections.

A cooling jacket may be coupled to the baseplate over the plurality of folded projections.

The cooling jacket may be configured to direct a cooling fluid to pass over the plurality of folded projections.

The plurality of folded projections may be made of a single piece of material.

The plurality of folded projections may be coupled to the baseplate by at least one of welding, soldering, or bonding.

Implementations of a fin frame assembly may include: a baseplate configured to be coupled to a substrate, a first set of regularly spaced projections formed from a strip of material, the first set of regularly spaced projections including base portions coupled to the baseplate, and a second set of regularly spaced projections formed from a strip of material, the second set of regularly spaced projections including base portions coupled to the baseplate. The first set of regularly spaced projections may be staggered relative to the second set of projections.

Implementations of the fin frame assembly may include one, all, or any of the following:

A first group of the first set of regularly spaced projections may be regularly higher than a second group of the first set of regularly spaced projections.

A shape of each projection of the first set of regularly spaced projections and a shape of each projection of the second set of regularly spaced projections may be substantially an isosceles trapezoid.

The base portions of the first set of regularly spaced projections and the second set of regularly spaced projections may couple within a perimeter of a plurality of recessed formed in the baseplate.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended fin frame assemblies will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such fin frame assemblies, and implementing components and methods, consistent with the intended operation and methods.

Figure 1:
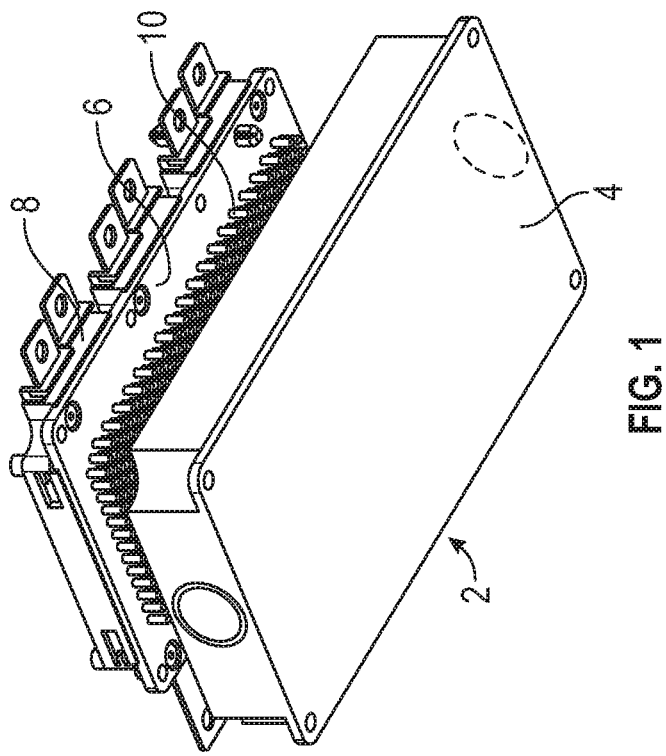
FIG. 1 illustrates an underside view of an implementation of a single side direct cooling (SSDC) unit.

Referring to FIG. 1, an underside view of an implementation of a single side direct cooling (SSDC) unit is illustrated. The SSDC unit 2 includes a cooling jacket 4 coupled to an SSDC package 8, as illustrated. In various implementations, the cooling jacket 4 may be configured to couple to a baseplate 6 over a fin frame 10, as illustrated. In various implementations, heat is produced by the SSDC package 8 and is transferred to the baseplate 6, which is in close physical contact with the SSDC package 8. In such implementations, the baseplate 6 is made of a thermally conductive material, such as, by non-limiting example, a metal, a ceramic, a metal alloy, a combination of metal and ceramic, a composite, or any other thermally conductive material shapeable into a plane and/or pin form. By non-limiting example, the fin frame 10 includes pins, fins, or projections that extend away from the baseplate 6 to increase the surface area, thereby improve thermal conductivity. In various implementations the baseplate 6 and the fin frame 10 may form a fin frame assembly or conductive plate.

Figure 2:
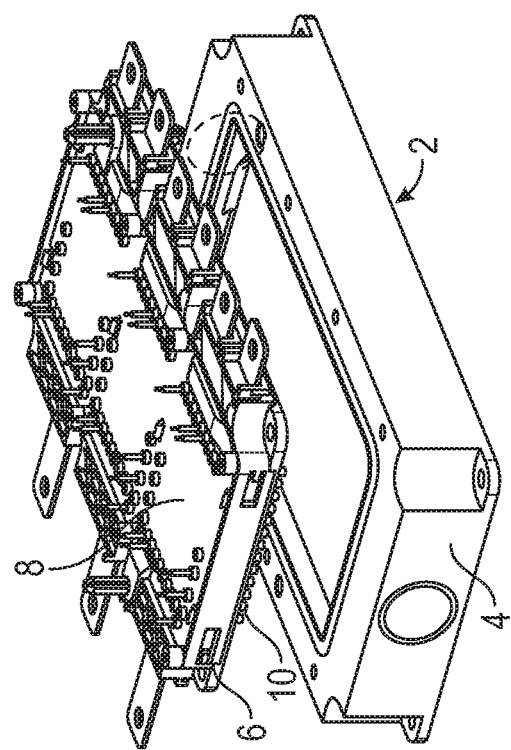
FIG. 2 illustrates a top side view of the implementation of the SSDC unit of FIG. 1.

Referring to FIG. 2, a top side view of the implementation of the SSDC unit of FIG. 1 is illustrated. In this alternative view, the SSDC unit 2, which includes the cooling jacket 4 coupled to the SSDC package 8, is illustrated. As illustrated, the cooling jacket 4 may be configured to couple to the baseplate 6 over the fin frame 10, placing the plurality of pins of the fin frame 10 into an opening in the baseplate 6.

Figure 3:
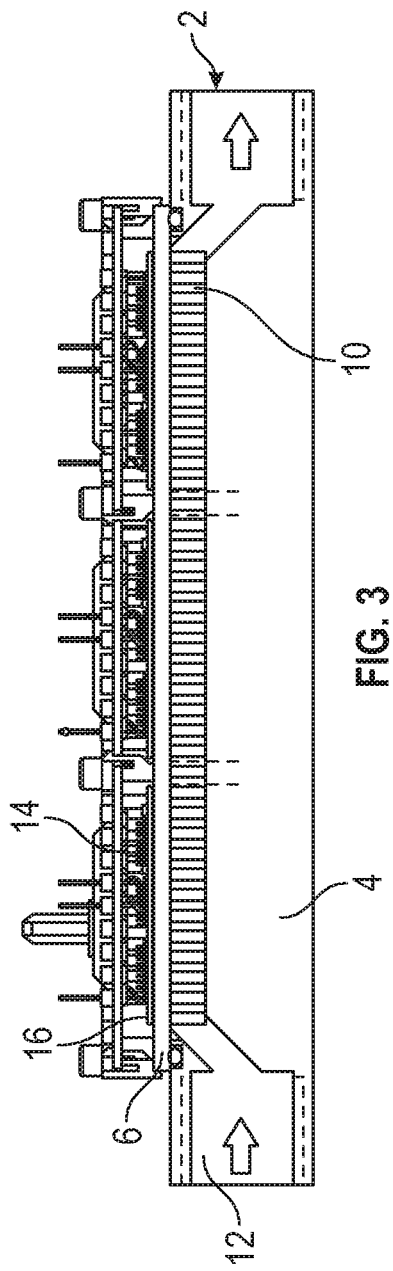
FIG. 3 illustrates a cross-sectional view of the implementation of the SSDC unit of FIG. 1.

Referring to FIG. 3, a cross-sectional view of the implementation of the SSDC unit 2 of FIG. 1 is illustrated. The SSDC unit 2 includes the baseplate 6, as illustrated. The baseplate 6 may be coupled directly to, or coupled through one or more layers of material to, a substrate 16, as illustrated. In various implementations, the substrate may be a direct bonded copper (DBC) substrate, a gallium substrate, a silicon substrate, an aluminum nitride substrate or any other substrate material, by non-limiting example. As illustrated, a plurality of semiconductor die 14 may be coupled to the substrate 16. As illustrated, the SSDC unit 2 includes the cooling jacket 4 coupled to the baseplate 6 over the fin frame 10. The SSDC unit 2 includes a fluid passage 12 configured to pass a fluid into and through the cooling jacket 4 to an exit fluid passage. In various implementations, the cooling jacket 4 directs a cooling fluid to pass over the plurality of pins/fins/projections of the fin frame 10 during operation of the semiconductor devices coupled to the substrate, thereby removing heat generated by the semiconductor devices. In various implementations, by non-limiting example, the cooling fluid may be water, air, or any other compound or mixture that may increase the amount of heat that can be dissipated away from the SSDC package 8.

Figure 4:
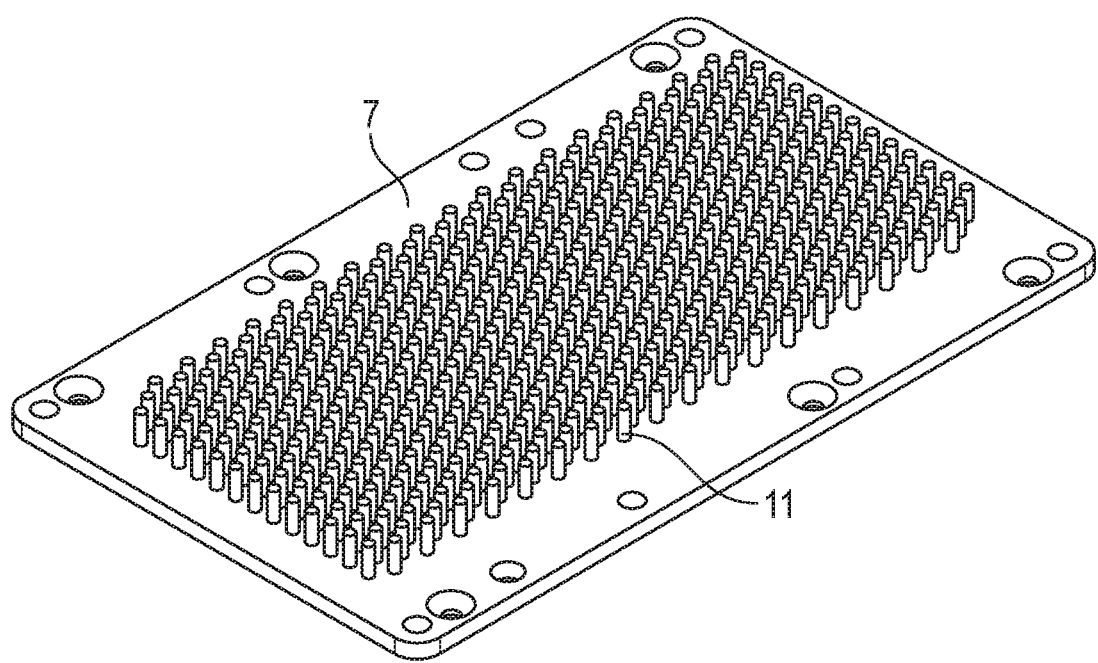
FIG. 4 illustrates an implementation of a pin fin assembly including a baseplate.

Referring to FIG. 4, an implementation of a pin fin assembly including a baseplate is illustrated. A plurality of pins 11 are coupled to a baseplate 7, as illustrated. In various implementations, this baseplate 7 is constructed of a flat, substantially planar, solid piece of thermally conductive material, such as, by non-limiting example, aluminum, copper, nickel or other metallic materials. In various implementations, the baseplate 7 is configured to couple to a substrate, and to be included in an SSDC package as previously disclosed. In various implementations, the plurality of pins 11 may altogether form a fin frame, or fin frame assembly, to be included in an SSDC package as previously disclosed. As illustrated, the plurality of pins 11 are cylindrical in shape, though they may be of any other shape, such as, by non-limiting example, rectangular, triangular, trapezoidal, or another three dimensional shape.

Figure 5:
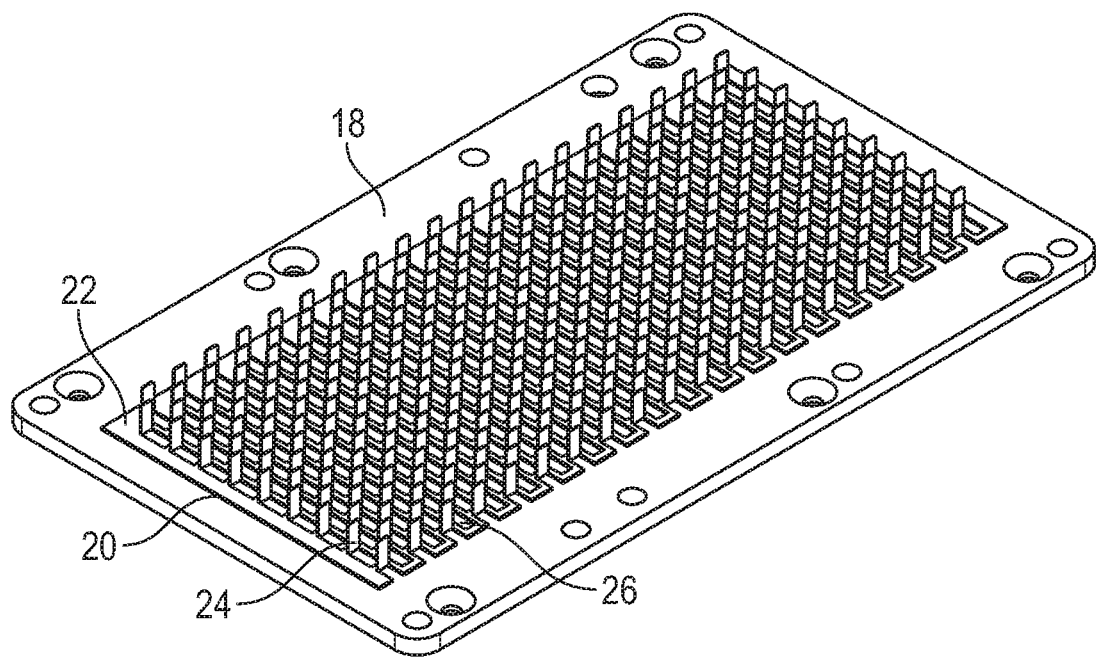
FIG. 5 illustrates an implementation of a fin frame assembly including a baseplate.

Referring to FIG. 5, an implementation of a fin frame assembly including a baseplate is illustrated. The fin frame assembly includes a baseplate 18, as illustrated. In various implementations, the baseplate 18 is designed couple to a substrate like any type disclosed in this document. As illustrated, the fin frame assembly also includes a fin frame 20. The fin frame 20 includes base portion 22, which is coupled to the baseplate 18, as illustrated. In various implementations, the base portion 22 of the fin frame 20 is substantially planar, and is configured to couple directly to the baseplate 18, though the fin frame 20 can be configured to couple to a baseplate with a non-planar or textured surface as well. Each of a plurality of fins 24 extends and protrudes from the base portion 22, as illustrated. Additionally, the fin frame 20 includes each of a plurality of openings 26 through the fin frame 20. In various implementations, during manufacture of the fin frame 20, each fin 24 may be partially "punched" out from the base portion 22, and bent upward, so as to protrude away from the base portion 22. In this way, the shape of each of the plurality of openings 26 corresponds with the shape of each fin 24 as each fin 24 originally resided in the opening 26 before being bent upward.

In various implementations, an outline of the plurality of fins 24 may be cut from a single sheet of material, and the fins 24 may be bent upward, as previously disclosed. In various other implementations, the plurality of fins 24 may be formed from a single sheet of material that is pressed into a die, thus puncturing the sheet of material and forming each of the plurality of fins 24 and the plurality of openings 26 simultaneously. In various implementations, the fin frame 20 is made of a homogeneous material, with the base portion 22 and the plurality of fins 24 being constructed of the same material. In various implementations, the fin frame 20 may be formed of a single piece of material; in other implementations, the fin frame 20 may be formed of two or more layers of material coupled together. In still other implementations, the plurality of fins 24 may be treated to further enhance their thermal conductivity, such as by, non-limiting example, coating, plating, etching, or otherwise depositing, removing, or exchanging material from the fins. This processing of the fins 24 may be done along with or separately from the remainder of the fin frame 20.

Figure 6:
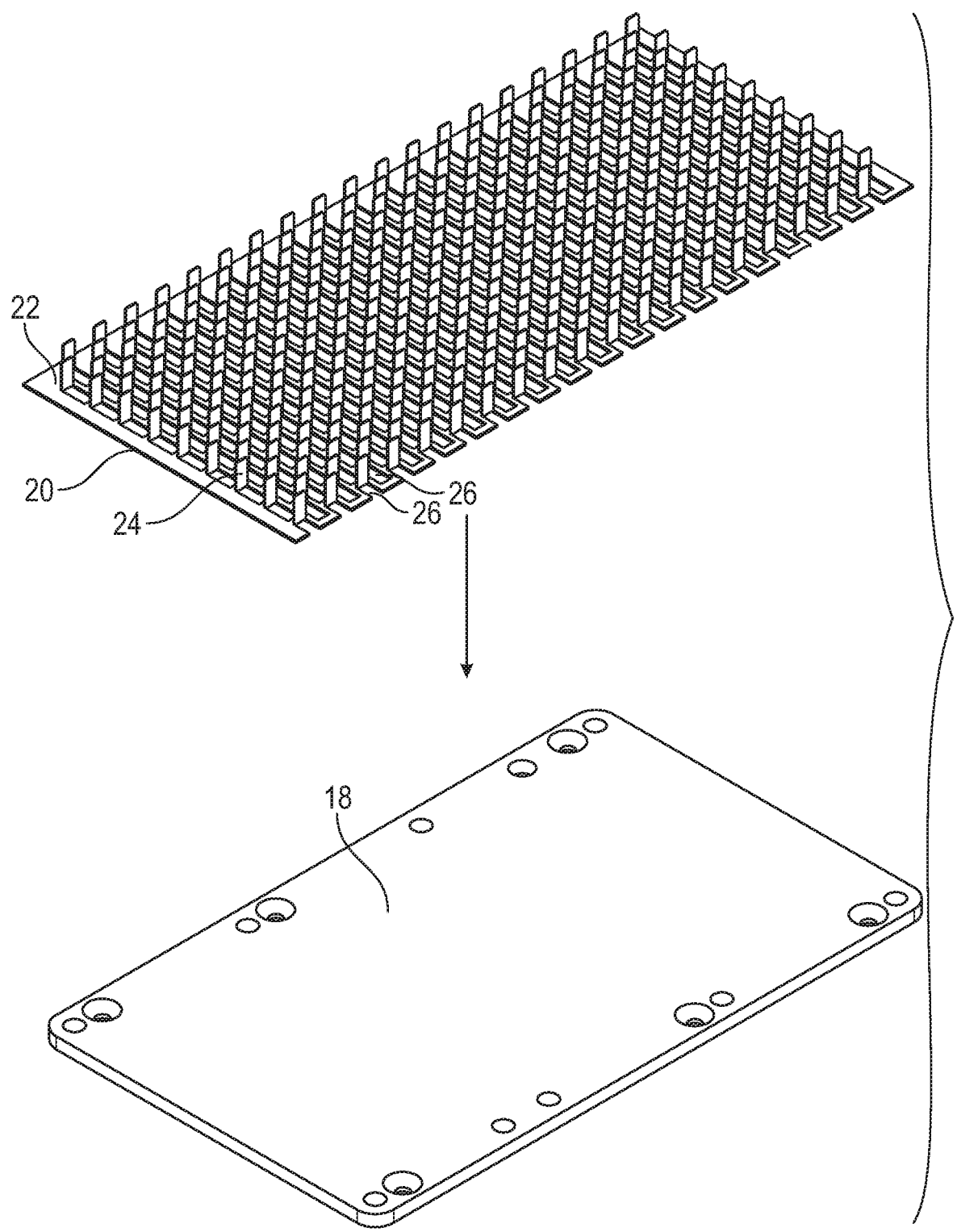
FIG. 6 illustrates the fin frame assembly and the baseplate of FIG. 5 separately.

Referring to FIG. 6, the fin frame assembly and the baseplate of FIG. 5 shown separately are illustrated. As shown, the fin frame 20 includes a base portion 22 and a plurality of fins 24 that are formed of one piece of material. In various implementations, by non-limiting example, the plurality of fins 24 are formed separate from the base portion 22 and may be bonded to the base portion 22 by various methods and processes, including, by non-limiting example, welding, gluing, epoxy, soldering, bonding, or any other method of coupling two materials together. In implementations where the fin frame 20 is formed of one piece of material, each fin of the plurality of fins 24, may be bent upward from, punched out from, stamped, pressed, etched, or otherwise formed from, the base portion 22, so that the fins 24 are a plurality of folded projections that extend away from, or protrude from, the base portion 22, creating a plurality of correspondingly shaped openings 26 in the base portion. In such implementations, a shape of each opening of the plurality of openings 26 corresponds substantially with a shape of each fin of the plurality of fins 24. As illustrated, the shapes of each fin 24 and each opening 26 may be rectangular. In other implementations, by non-limiting example, the shapes of each fin 24 and each opening 26 may be triangular, square, trapezoidal, or may be of any other shape. In various implementations, once the fin frame 20 is formed, it may be bonded or coupled to the baseplate 18 by welding, epoxy, glue, soldering, or any suitable combination thereof, by non-limiting example. The fin frame assembly can then be used with a SSDC by any means disclosed herein.

Figure 7:
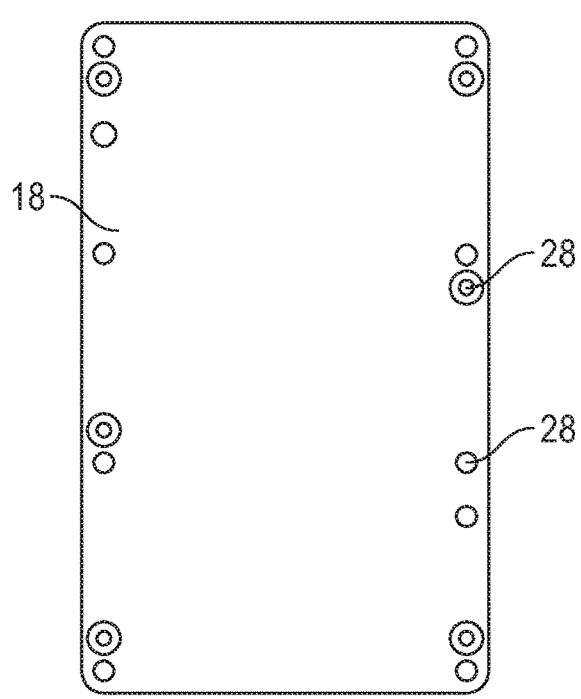
FIG. 7 illustrates a top view of the baseplate of FIG. 6.

Referring to FIG. 7, a top view of the baseplate of FIG. 6 is illustrated. The baseplate 18 may include holes/openings 28 whereby the baseplate 18 may be attached with screws, pins, or any other attaching means, to an SSDC, the cooling jacket, substrate, or another component. As illustrated, the baseplate 18 may be substantially rectangular, square, circular, or of any other suitable shape according to the disclosure herein.

Figure 8:
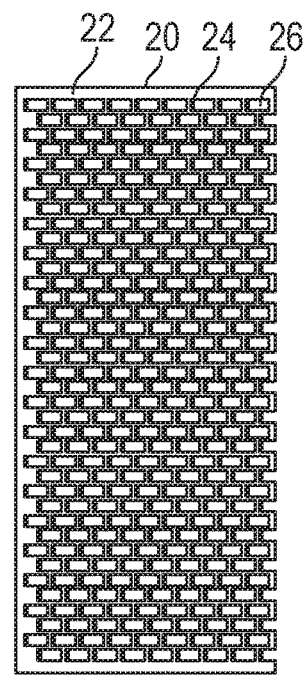
FIG. 8 illustrates a top view of the fin frame assembly of FIG. 6.

Referring to FIG. 8, a top view of the fin frame assembly of FIG. 6 is illustrated. The fin frame 20 includes the plurality of fins 24, or projections, that are bent upward, and protrude away from the base portion 22 of the fin frame 20, as illustrated. In various implementations, by non-limiting example, each fin 24 may extend or protrude at an about 90 degree angle relative to the base portion 22, or each fin 24 may extend or protrude at any other angle greater than 90 degrees or less than 90 degrees relative to the base portion 22, so as to allow the flow of a fluid, such as, by non-limiting example, water, air, gas, or any other flowable fluid over the fins 24. In other various implementations, by non-limiting example, each fin 24 may extend or protrude at differing angles relative to each of the other fins 24 and to the base portion 22. As illustrated, voids created by the folded and protruding fins 24 creates openings 26 that correspond with the shape of each fin 24. In various implementations, the shapes of each fin of the plurality of fins 24 may be the same, or they may be different relative to each other. As illustrated in the version in FIG. 9, the fins 24 are uniform in size and shape, and are arranged in staggered alternating rows across the base portion 22. This arrangement may be formed to improve the thermal conductivity of the fin frame 20 and fins 24. In other various implementations, by non-limiting example, the fins 24 may be arranged in any other pattern on the base portion 22.

Figure 9:
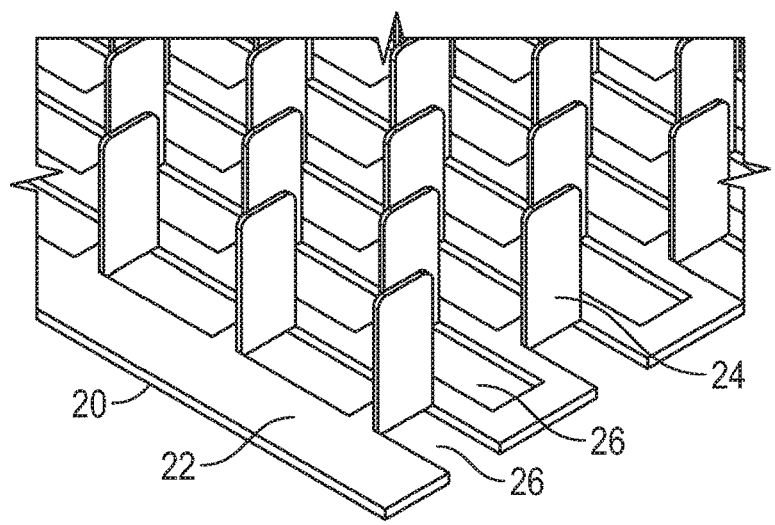
FIG. 9 illustrates a magnified view of the fin frame assembly of FIG. 6.

Referring to FIG. 9, a magnified view of the fin frame assembly of FIG. 6 is illustrated. As shown, the fin frame 20 includes the base portion 22 and the plurality of fins 24 formed of one single piece of material. As illustrated, each fin or projection of the plurality of fins 24 protrudes away from the base portion 22 at an edge of each corresponding opening 26 within the base portion 22 of the fin frame 20. In various implementations, by non-limiting example, the plurality of fins 24 may be formed to extend to the edge of the fin frame 20, with the opening 26 creating a notch/re-entrant opening in the edge of the fin frame 20, as illustrated. However, in other various implementations, the fins 24 may not fully extend to the edge of the fin frame 20. In various implementations, each fin of the plurality of fins 24 may be longer in length than in width, and may have rounded corners, to form a substantially rectangular shape, as illustrated. Though in other various implementations, by non-limiting example, the fins 24 may be a wide variety of other closed shapes, sizes, and different orientations.

Figure 10:
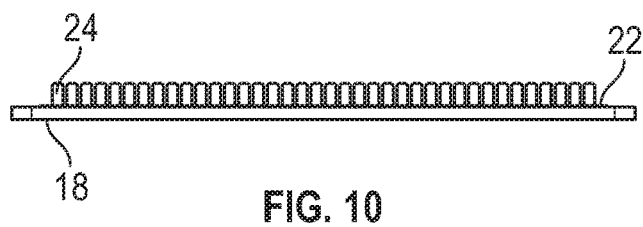
FIG. 10 illustrates a lengthwise side view of the implementation of the fin frame assembly of FIG. 5.
Figure 11:
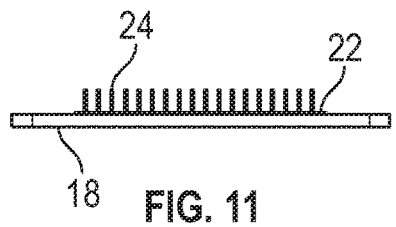
FIG. 11 illustrates a widthwise side view of the implementation of the fin frame assembly of FIG. 5.

Referring to FIG. 10, a lengthwise side view of the implementation of the fin frame assembly of FIG. 5 is illustrated. The base portion 22 of the fin frame is coupled with the baseplate 18, as illustrated. The plurality of fins 24 extend, protrude, or project outwards from the baseplate 18 and base portion 22, as illustrated. Referring now to FIG. 11, a widthwise side view of the implementation of the fin frame assembly of FIG. 5 is illustrated. This widthwise side view shows that in the direction of flow the pins do not obstruct flow as much as they do in the lengthwise view, allowing the fluid to flow around the various pins without much pressure drop across the fin frame.

Figure 12:
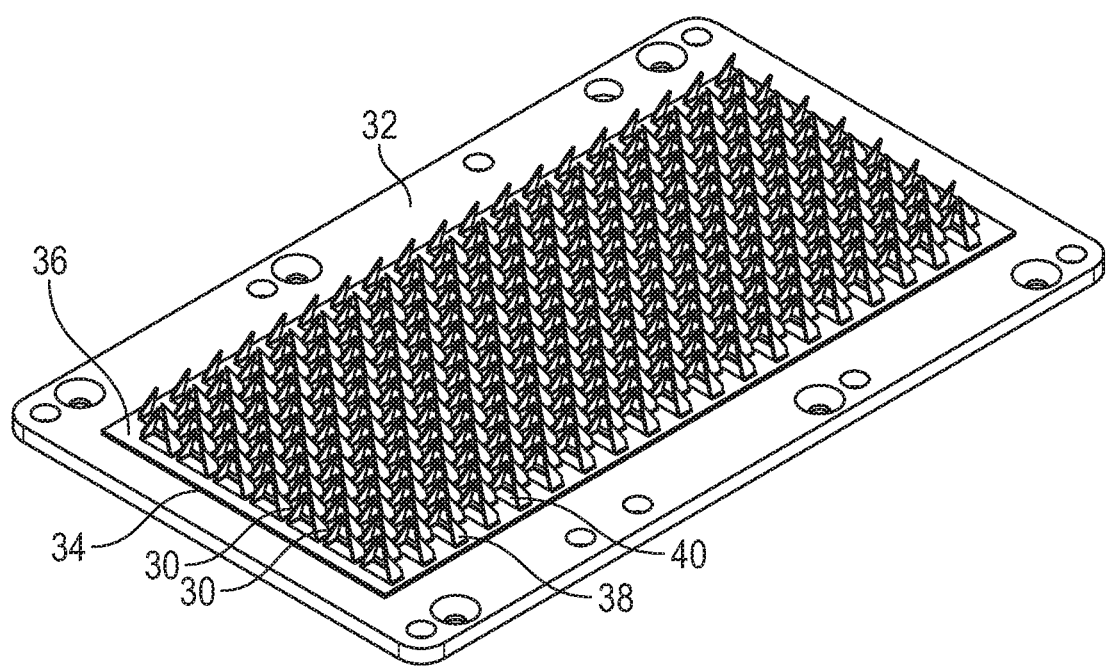
FIG. 12 illustrates an alternative implementation of a fin frame assembly including a baseplate.

Referring to FIG. 12, another implementation of a fin frame assembly including a baseplate is illustrated. The fin frame assembly includes a baseplate 32, as illustrated. In various implementations, the baseplate 32 is designed to couple to a substrate like any disclosed herein. As illustrated, the fin frame assembly also includes a fin frame 34. The fin frame 34 includes a base portion 36, which is coupled to the baseplate 32 using any structure or system like those disclosed herein. In various implementations, the base portion 36 of the fin frame 34 is substantially planar, and is configured to couple to the baseplate 32, though the fin frame 34 can be configured to couple to a baseplate with a non-planar surface as well. Each of a plurality of fins 38 extends and protrudes from the base portion 36, as illustrated. Additionally, the fin frame 34 includes each of a plurality of openings 40 through the fin frame 34. In various implementations, each fin 34 may be partially "punched" out from the base portion 36, and bent upward, as previously described in this document, so as to protrude away from the base portion 36.

In various implementations, an outline of the plurality of fins 38 may be cut from a single sheet of material, and the fins 38 may be bent upward, as previously disclosed. The sheet of material may a single piece, or may be formed from multiple layers as previously described. In various other implementations, the plurality of fins 38 may be formed from a single sheet of material that is pressed into a die, thus puncturing the sheet of material and simultaneously forming each of the plurality of fins 38. The fins and/or fin frame may be formed and processed with coatings or other materials using any method disclosed in this document. Also, the fin frame may be coupled to the base portion using any of the systems or structures previously described.

Figure 14:
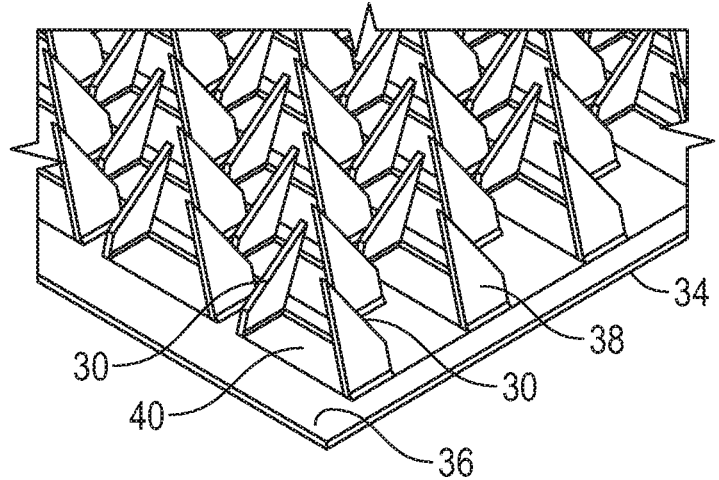
FIG. 14 illustrates a magnified view of the fin frame assembly of FIG. 12.

As illustrated in FIGS. 12 and 14, a shape of each opening of the plurality of openings 40 corresponds with a shape formed by two or more fins of the plurality of fins 38, as illustrated. As illustrated, the plurality of fins 38 are formed as pairs of fins, each of the pairs of fins including complementarily angled portions 30 defined by a diagonal line (or N-shaped line) between each fin in each pair of fins. In such implementations, each fin in each pair of fins may be substantially trapezoidal in shape and each fin substantially a mirror image of the other fin. As illustrated, each pair of fins are located on an opposing edge of each opening of the plurality of openings 40.

Figure 13:
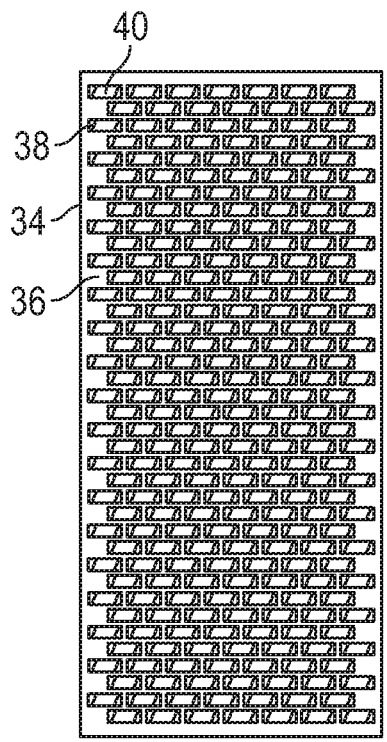
FIG. 13 illustrates a top view of the fin frame assembly of FIG. 12.

Referring to FIG. 13, a top view of the fin frame assembly of FIG. 12 is illustrated. The fin frame 34 includes the plurality of fins 38, or projections, that are bent upward, and protrude away at an angle from the base portion 36 of the fin frame 34, as illustrated. In various implementations, by non-limiting example, each fin 38 may extend or protrude at a 45 degree angle relative to the base portion 36, or each fin 38 may extend or protrude at more or less than 45 degrees to the base portion 36, so as to allow the flow of fluid over the fins 38. In other various implementations, by non-limiting example, each pair of fins 38 extend or protrude at opposing angles relative to each other and the base portion 36. As illustrated, voids created by the folded and protruding fins 38 creates openings 40 that correspond with the shape of each pair of fins. As illustrated, the fins 38 are uniform in size and shape, relative to each pair of fins, and are arranged in staggered rows across the base portion 36. In other various implementations, by non-limiting example, the fins 38 may be arranged in any other desired pattern on the base portion 36.

Referring to FIG. 14, a magnified view of the fin frame assembly of FIG. 12 is illustrated. As illustrated, each fin of each pair of fins in the plurality of fins 38 includes a complimentary angled portion 30 between each substantially trapezoidal shaped fin, and thus the opening 40 created in the base portion 36 by each pair of fins is substantially rectangular in shape.

Figure 15:
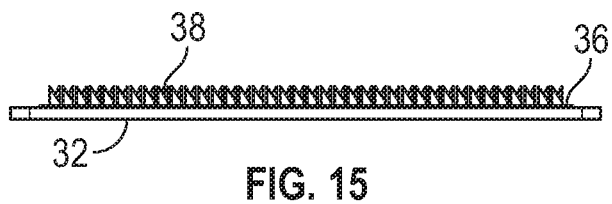
FIG. 15 illustrates a lengthwise side view of the implementation of the fin frame assembly of FIG. 12.
Figure 16:
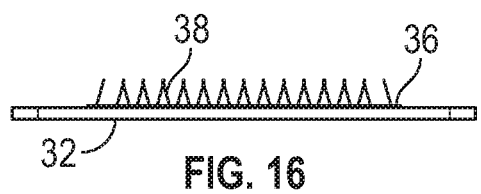
FIG. 16 illustrates a widthwise side view of the implementation of the fin frame assembly of FIG. 12.

Referring to FIG. 15, a lengthwise side view of the implementation of the fin frame assembly of FIG. 12 is illustrated. The base portion 36 of the fin frame is coupled with the baseplate 32, as illustrated. The plurality of fins 38 extend, protrude, or project outwards from the baseplate 32 and base portion 36, as illustrated forming rows of oppositely oriented angled features. Referring now to FIG. 16, a widthwise side view of the implementation of the fin frame assembly of FIG. 12 is illustrated. In this orientation, the fins form triangularly arranged rows of angled fins in the direction of fluid flow, which are designed to cause low pressure drop across the fin frame assembly.

Figure 17:
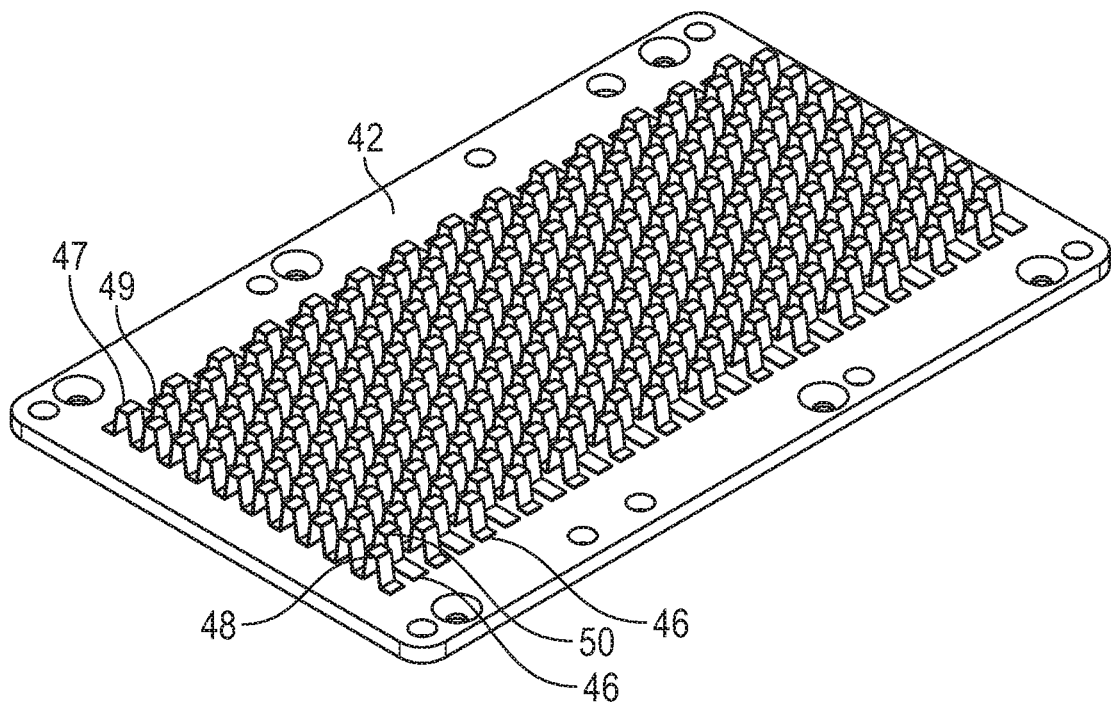
FIG. 17 illustrates another alternative implementation of a fin frame assembly including a baseplate.

Referring to FIG. 17, another implementation of a fin frame assembly including a baseplate is illustrated. The baseplate 42 may be any disclosed in this document. As illustrated, the fin frame assembly also includes a plurality of strips of material 47 that are bent, stamped, folded, or the like, into repeating shapes along the length of the strip of material, as illustrated. As illustrated, a first set of projections 48 and base portions 46 are formed in the strip of material 47. As shown, each strip of material 47 also includes a plurality of base portions 46 that are configured to couple to the baseplate 42. In various implementations, the base portions 46 are substantially planar, and are designed to couple to a substantially planar baseplate 42, though the base portions 46 can be configured to couple to a baseplate with a non-planar/textured surface as well. In various implementations, the projections 48 are regularly spaced apart from one another like that illustrated in FIG. 17, though in other implementations, the projections 48 may be irregularly spaced along the strip of material 47. As illustrated, a second set of projections 50 and base portions 46 are formed from another strip of material 49. The second set of projections 50 and base portions 46 may be formed into the same shapes as the first set of projections 48 and base portions 46 or into a different shapes from the first set of projections and/or base portions 46. As illustrated, the shapes of the each of the projections 48, 50 may substantially form an isosceles trapezoid. As illustrated, the first set of projections 48 is staggered relative to the second set of projections 50 through the projections formed in the first strip of material 47 being formed in a different order along the strip than in the second strip of material 49. In other various implementations, there may be three or more sets of projections that are staggered relative to each other arranged and ordered side by side in various combinations. In this way, desired fluid or air pathways can be created.

Still referring to FIG. 17, each of the projections 48, 50 extends and protrudes away from the base portions 46 and baseplate 42, as illustrated. In various implementations, the projections 48, 50 may be treated to further enhance their thermal conductivity, such as by coating or otherwise processing the projections 48, 50 using any method or structure like that disclosed for the various fin implementations. In such implementations, such a coating or treatment can be applied to the entire fin frame assembly. In various implementations, by non-limiting example, the strips of material 47, 49 may be bonded to the baseplate 42 by one of welding, glue, epoxy, soldering, or any other coupling method disclosed herein. In other various implementations, the strips of material 47, 49 may be coupled together in various sets of strips, or may be coupled to a common base, which may then be coupled to the baseplate 42. In various implementations, the strips of material 47, 49 may be made of a single piece of material or may be made of two or more layers of material like any fin implementation disclosed herein. The fin frame assembly can then be used with a baseplate and fluid heat transfer jacket like any disclosed herein.

Figure 18:
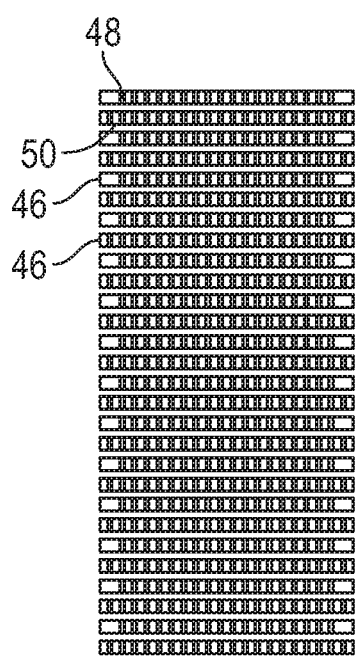
FIG. 18 illustrates a top view of the fin frame assembly of FIG. 17.

Referring to FIG. 18, a top view of the fin frame assembly of FIG. 17 is illustrated. As illustrated, the projections 48, 50 are uniform in size and shape, and are staggered in rows across the baseplate. This arrangement formed by putting the different strips in a desired order to create the staggering may be formed to improve the heat transfer available from of the projections 48, 50 to the fluid. In other various implementations, by non-limiting example, the projections 48, 50 may be arranged in any other pattern or may be randomly arranged relative to one another.

Figure 19:
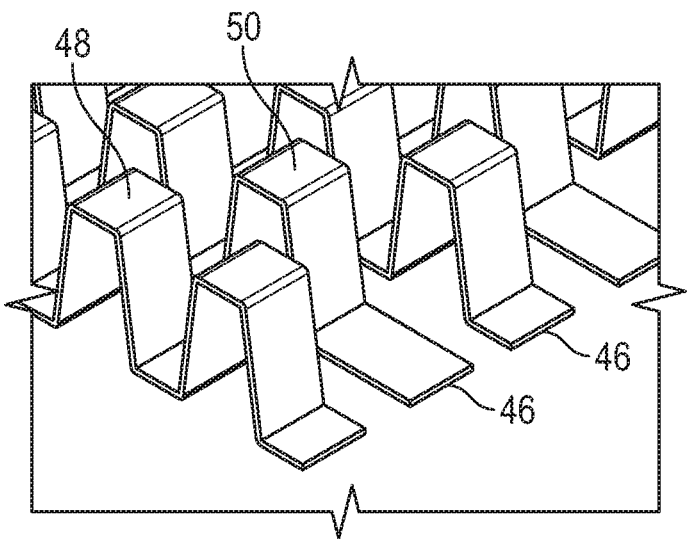
FIG. 19 illustrates a magnified view of the fin frame assembly of FIG. 17.

Referring to FIG. 19, a magnified view of the fin frame assembly of FIG. 17 is illustrated. As illustrated, each projection 48, 50 protrudes away from its corresponding base portion 46, by folding/bending the material of the strip. In the implementation illustrated, the shape of each projection may form an isosceles trapezoid. However in other implementations, the projections 48, 50 may be of different shapes, sizes, may be angled, and may have different orientations relative to one another.

Figure 20:
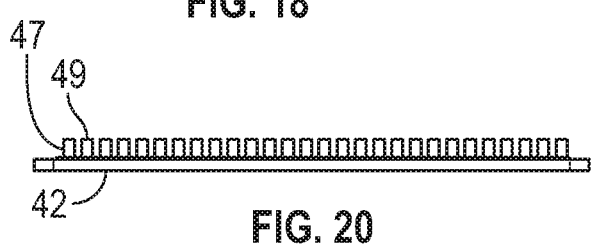
FIG. 20 illustrates a lengthwise side view of the implementation of the fin frame assembly of FIG. 17.
Figure 21:
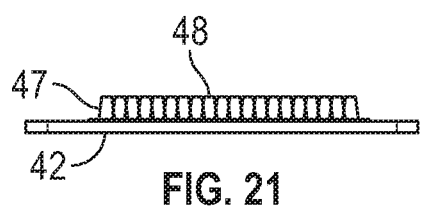
FIG. 21 illustrates a widthwise side view of the implementation of the fin frame assembly of FIG. 17.

Referring to FIG. 20, a lengthwise side view of the implementation of the fin frame assembly of FIG. 17 is illustrated. In this implementation, similar to the fin versions previously illustrated, the projections place most of the material in the array parallel with the direction of flow of the fluid. Referring now to FIG. 21, a widthwise side view of the implementation of the fin frame assembly of FIG. 20 is illustrated. As illustrated, in this view, the projections form a set of channels along the fin frame which may assist in facilitating heat transfer through creating turbulent flow or more laminar flow conditions, depending on what is desired.

Figure 22:
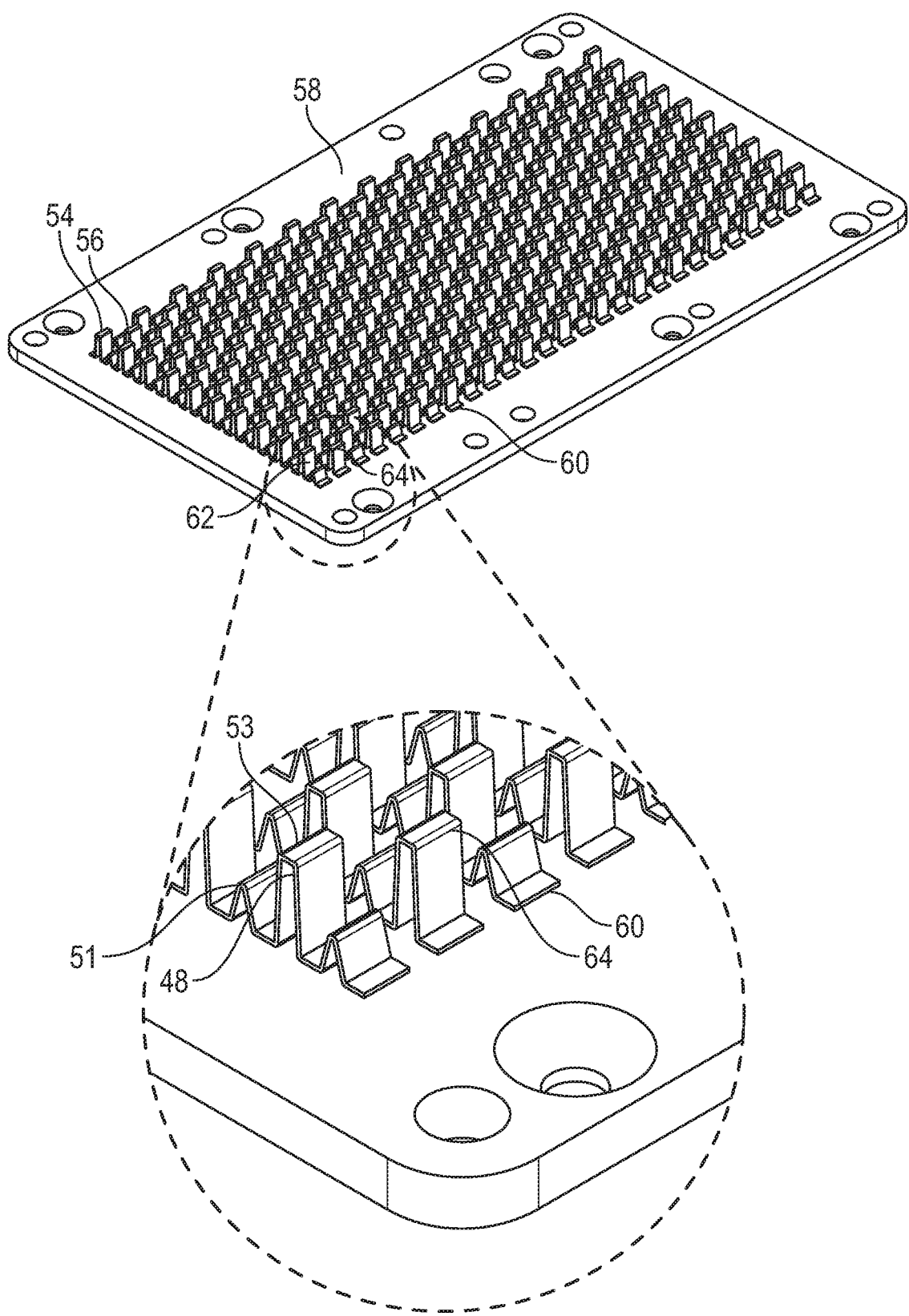
FIG. 22 illustrates a magnified perspective view of another implementation of a fin frame including higher and lower projections.

Referring to FIG. 22, a magnified perspective view of the implementation of another fin frame assembly including higher and lower projections is illustrated. The strips of material 54, 56 are coupled to the baseplate 58, as illustrated. In various implementations, the size and shape of each base portion 60 may be the same or similar, as illustrated. As illustrated, a first group 53 of the first set of projections 62 is regularly higher than a second group 51 of the first set of projections 62. In various implementations, a first group of the second set of projections 64 may also be higher than a second group of the second set of projections 64. In various implementations, there may be three, four, or more different heights of raised portions of the projections. In various implementations, there may be a raised portion that has two heights, resulting in a stepped profile of projections. In various implementations, the second group 51 of the first set of projections 62 may have a peaked top while the first group 53 may have a flat top, as illustrated. In various other implementations, the profile of the top of the projections 62, 64 can be of any suitable combination of peaked and flat tops, including all peaked, all flat, and some of each. The length of the flat top can vary as well, with some being greater in length than others. As illustrated, the strips of material 54, 56 can be arranged in a staggered pattern with the second group 51 of the first set of projections 62 of a first strip of material 54 being aligned with a first (higher) group of the second set of projections 64 of the second strip of material 56. Fluid, or air, is then allowed to flow, or is urged to flow, through the strips and underneath the projections to advantageously conduct thermal energy away from the baseplate 58.

Figure 23:
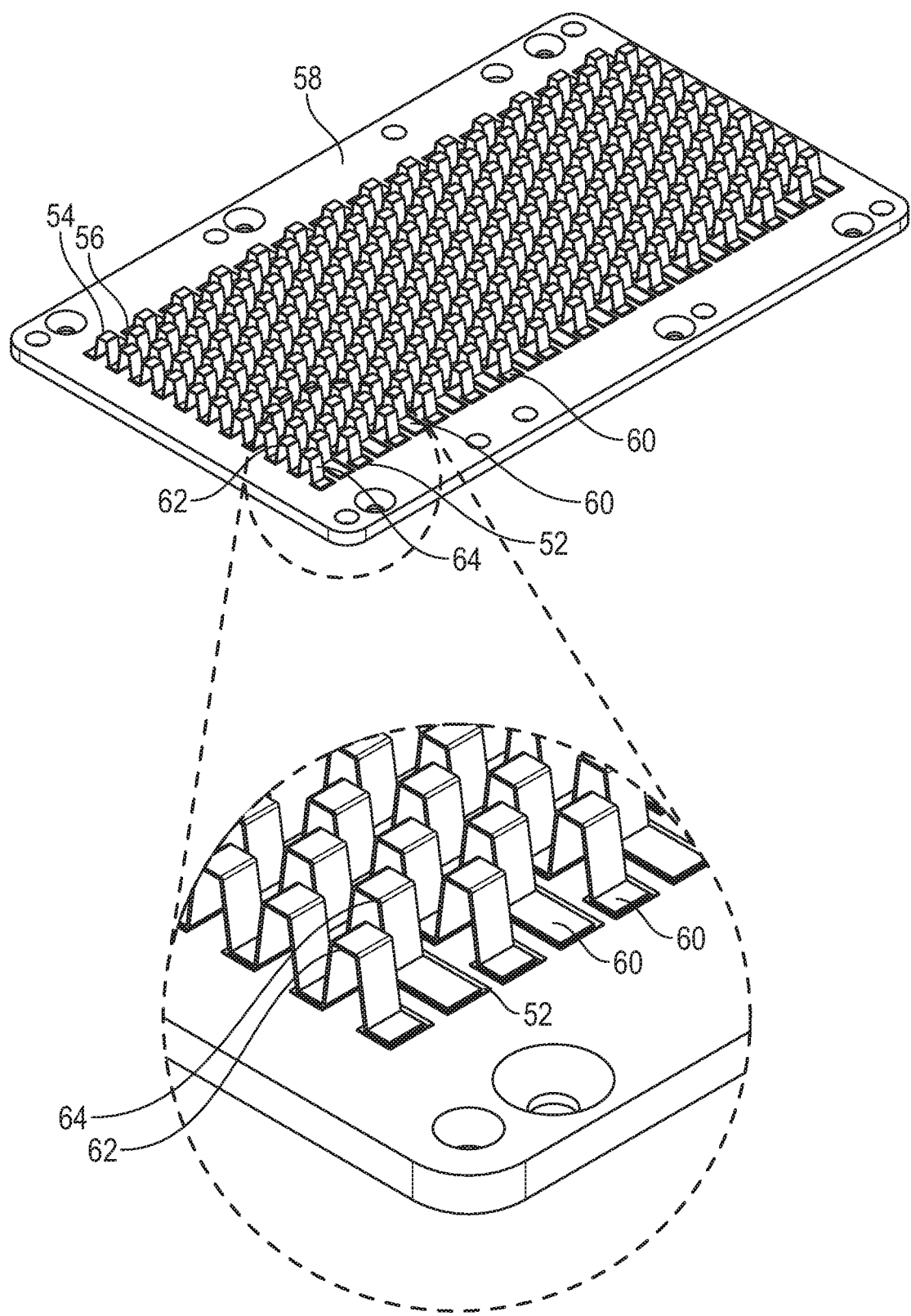
FIG. 23 illustrates a magnified perspective view of the implementation of the fin frame assembly of FIG. 17 including recesses.

Referring to FIG. 23, a magnified perspective view of the implementation of the fin frame assembly of FIG. 17 including recesses is illustrated. As illustrated, the baseplate 58 can include a pattern of recesses 52 on its surface that correspond to receive the perimeters of the base portions 60 of the strips of material 54, 56. In various implementations, the pattern of the recesses 52 may be configured according to the staggered pattern of the strips of material 54, 56 and/or to the pattern of the projections 62, 64. In various implementations, the recesses 52 can be slightly larger in size than the perimeters of the base portions 60 so that there is not a friction fit between the baseplate 58 and the base portion 60; rather the recess 52 serves as a locating/bonding feature for attachment. In various implementations, the recesses 52 can help to apply an adhesive, epoxy, or other bonding material, or to serve as a locator for a welding or soldering operation. In such implementations, an adhesive or bonding material can be placed onto the entire surface of the baseplate 42 and then excess adhesive or bonding material can be wiped from the surface of the baseplate 58 with a flat scraper, leaving adhesive in the recesses 52 and not on the remaining surface of the baseplate 58. In this way, the adhesive or bonding can be used to couple the base portions 60 into the recesses.

In other implementations, the recesses may not be used and the various strips of material may be bonded/coupled to the baseplate using any of the methods disclosed in this document.

In places where the description above refers to particular implementations of fin frame assemblies and implementing components, sub-components, methods and sub-methods, it should be readily apparent that a number of modifications may be made without departing from the spirit thereof and that these implementations, implementing components, sub-components, methods and sub-methods may be applied to other fin frame assemblies.

What is claimed is:

1. A fin frame assembly, comprising:
a baseplate configured to be coupled to a substrate; and
a fin frame comprising a base portion coupled to the baseplate and a plurality of fins extending from the base portion, the plurality of fins protruding from the base portion;
wherein the fin frame comprises a plurality of openings therethrough; and one of:
where a shape of each opening of the plurality of openings corresponds with a shape of each fin of the plurality of fins; or
where a shape of each opening of the plurality of openings corresponds with a shape of two or more fins of the plurality of fins.

2. The fin frame assembly of claim 1, wherein a shape of each fin of the plurality of fins is substantially rectangular.

3. The fin frame assembly of claim 1, wherein the plurality of fins comprise pairs of fins, each of the pairs of fins comprising complementarily angled portions defined by a diagonal line between each fin in each pair of fins.

4. The fin frame assembly of claim 1, further comprising a cooling jacket coupled to the baseplate over the fin frame.

5. The fin frame assembly of claim 4, wherein the cooling jacket is configured to direct a cooling fluid to pass over the plurality of fins.

6. The fin frame assembly of claim 1, wherein the fin frame is comprised of a single piece of material.

7. The fin frame assembly of claim 1, wherein the fin frame is coupled to the baseplate by at least one of welding, soldering, or bonding.

8. A conductive plate, comprising:
a baseplate configured to be coupled to a substrate;
a plurality of folded projections coupled at a plurality of openings; and
a cooling jacket coupled to the baseplate over the plurality of folded projections;
wherein a shape of each folded projection of the plurality of folded projections corresponds with a shape of each opening of the plurality of openings.

9. The conductive plate of claim 8, wherein the shape of each opening of the plurality of openings corresponds with a shape of two or more folded projections of the plurality of folded projections.

10. The conductive plate of claim 8, wherein the shape of each folded projection of the plurality of folded projections is substantially rectangular.

11. The conductive plate of claim 8, wherein the plurality of folded projections comprise pairs of folded projections, each of the pairs of folded projections comprising complementarily angled portions defined by a diagonal line between each folded projection in each pair of folded projections.

12. The conductive plate of claim 8, wherein the cooling jacket is configured to direct a cooling fluid to pass over the plurality of folded projections.

13. The conductive plate of claim 8, wherein the plurality of folded projections is comprised of a single piece of material.

14. The conductive plate of claim 8, wherein the plurality of folded projections is coupled to the baseplate by at least one of welding, soldering, or bonding.

15. A fin frame assembly, comprising: a baseplate configured to be coupled to a substrate; a first set of regularly spaced projections formed from a first strip of material, the first set of regularly spaced projections comprising base portions coupled to the baseplate; and a second set of regularly spaced projections formed from a second strip of material physically separate from the first strip of material the second set of regularly spaced projections comprising base portions coupled to the baseplate; wherein the first set of regularly spaced projections is staggered relative to the second set of regularly spaced projections; and wherein the base portions of the first set of regularly spaced projections and the second set of regularly spaced projections couple within a perimeter of a plurality of recesses formed in the baseplate.

16. The fin frame assembly of claim 15, wherein a first group of the first set of regularly spaced projections is regularly higher than a second group of the first set of regularly spaced projections.

* * * * *